US008899995B2

(12) United States Patent
Bulur et al.

(10) Patent No.: US 8,899,995 B2
(45) Date of Patent: Dec. 2, 2014

(54) MODULAR BATTERY

(75) Inventors: Yakup Bulur, Rochester, MN (US); Richard J. Fishbune, Rochester, MN (US); Mark E. Maresh, Raleigh, NC (US); Neil C. Swenson, Rochester, MN (US); Adam M. Wheeler, Rochester, MN (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 138 days.

(21) Appl. No.: 13/620,416

(22) Filed: Sep. 14, 2012

(65) Prior Publication Data

US 2014/0080361 A1 Mar. 20, 2014

(51) Int. Cl.
*H01R 12/00* (2006.01)

(52) U.S. Cl.
USPC ............. 439/75; 439/701; 439/928; 429/122; 429/149; 429/160

(58) Field of Classification Search
USPC ............. 439/74, 75, 701, 928, 160; 429/122, 429/149, 160
See application file for complete search history.

(56) References Cited

U.S. PATENT DOCUMENTS

| | | | | | |
|---|---|---|---|---|---|
| 3,663,931 | A | * | 5/1972 | Brown | 439/75 |
| 4,149,764 | A | * | 4/1979 | Mattingly, Jr. | 439/75 |
| 4,552,422 | A | * | 11/1985 | Bennett et al. | 439/69 |
| 4,867,691 | A | * | 9/1989 | Eck | 439/82 |
| 5,367,431 | A | | 11/1994 | Kunishi et al. | |
| 5,411,400 | A | * | 5/1995 | Subrahmanyan et al. | 439/68 |
| 5,460,531 | A | * | 10/1995 | Vivio | 439/70 |
| 5,825,630 | A | * | 10/1998 | Taylor et al. | 361/790 |
| 5,940,263 | A | | 8/1999 | Jakoubovitch | |
| 6,027,828 | A | | 2/2000 | Hahn | |
| 6,146,778 | A | | 11/2000 | Rouillard et al. | |
| 6,773,848 | B1 | | 8/2004 | Nortoft et al. | |
| 7,108,940 | B2 | | 9/2006 | Sharrow et al. | |
| 7,198,866 | B2 | | 4/2007 | Miyamoto et al. | |

(Continued)

FOREIGN PATENT DOCUMENTS

| | | |
|---|---|---|
| DE | 19624887 | 1/1997 |
| EP | 507977 | 10/1992 |
| EP | 932214 | 7/1999 |

OTHER PUBLICATIONS

Ocean Server Technology, Inc., Large Battery System, 2004, 6 pages.

(Continued)

*Primary Examiner* — Gary Paumen
(74) *Attorney, Agent, or Firm* — Lieberman & Brandsdorfer, LLC

(57) ABSTRACT

A modular battery device may include a substantially planar dielectric substrate having a first major surface and a second major surface spaced from and opposite the first major surface. A plurality of conductive couplers may extend through the substrate from the first major surface to the second major surface at spaced locations. Each conductive coupler may have a first connector element disposed at the first major surface of the substrate electrically connected to an associated second connector element forming an extension extending from the second major surface of the substrate. The device may be selectively engageable with another such device by selectively mating the first connector element of a first conductive coupler on the device in mechanical and electrical engagement with the second connector element of a second conductive coupler on the other such device. Devices having batteries may be stacked to provide parallel and/or series connections.

25 Claims, 9 Drawing Sheets

(56) References Cited

U.S. PATENT DOCUMENTS

| | | |
|---|---|---|
| 7,816,055 B2 | 10/2010 | Jacobson et al. |
| 2003/0036311 A1 | 2/2003 | Benson et al. |
| 2006/0267546 A1 | 11/2006 | Shen et al. |
| 2007/0105409 A1* | 5/2007 | Brekosky et al. ............... 439/75 |
| 2008/0166926 A1* | 7/2008 | Seymour et al. .............. 439/701 |
| 2008/0207015 A1* | 8/2008 | Sueyoshi ........................ 439/75 |
| 2010/0029103 A1* | 2/2010 | Costello ........................ 439/75 |
| 2011/0117417 A1 | 5/2011 | Pitts |

OTHER PUBLICATIONS

Ecamion Inc., Lithium Modular Battery Pack, 9 pages.
goelectricdrive.com, A123 video presenting prismatic battery pack, Jun. 14, 2011, 4 pages.

* cited by examiner

MODULAR BATTERY

BACKGROUND

The present invention relates to the field of electronics, and more specifically, to interconnecting modules for electronic components such as batteries.

As portable computers, cell phones, and other battery-powered electronic devices become smaller, thinner, and more powerful, battery technology has evolved toward thinner, solid-state battery cells. With device component space at a premium, batteries and other electronic components must be connected reliably and securely in compact yet easily manufacturable ways.

BRIEF SUMMARY

According to one embodiment of the invention, a device may include a substantially planar dielectric substrate having a first major surface and a second major surface spaced from and opposite the first major surface. A plurality of conductive couplers may extend through the substrate from the first major surface to the second major surface at spaced locations. Each conductive coupler may have a first connector element disposed at the first major surface of the substrate electrically connected to an associated second connector element forming an extension extending from the second major surface of the substrate. The device may be selectively engageable with another such device by selectively mating the first connector element of a first conductive coupler on the device in mechanical and electrical engagement with the second connector element of a second conductive coupler on the other such device.

In another example, a system may include a module including a substantially planar dielectric substrate having a first major surface and a second major surface spaced from and opposite the first major surface. The module may include a first conductive coupler and a second conductive coupler, each conductive coupler extending through the substrate from the first major surface to the second major surface at spaced locations and having a first connector element disposed at the first major surface of the substrate electrically connected to an associated second connector element forming an extension extending from the second major surface of the substrate. The module may include a first electrically non-conductive aperture and a second electrically non-conductive aperture, the first and second apertures arranged with the first and second conductive couplers at the corners of a square. An electrical component may be included, having a first terminal electrically connected to the first conductive coupler and a second terminal electrically connected to the second conductive coupler. The device may be stackably engageable with another such device by selectively mating the second connector element of one of the conductive couplers on the device in mechanical and electrical engagement with the first connector element of one of the conductive couplers on the other device.

In another example, a system may include a first module and a second module, each module including a substantially planar dielectric substrate having a first major surface and a second major surface spaced from and opposite the first major surface, a first conductive coupler and a second conductive coupler, each conductive coupler extending through the substrate from the first major surface to the second major surface at spaced locations. Each conductive coupler may further have a first connector element disposed at the first major surface of the substrate electrically connected to an associated second connector element forming an extension extending from the second major surface of the substrate. An electrical energy storage unit may have a positive terminal electrically connected to the first conductive coupler and a negative terminal electrically connected to the second conductive coupler. The first module may be stackably engaged with the second module, the second connector element of one of the conductive couplers on the first module being selectively mated in mechanical and electrical engagement with the first connector element of one of the conductive couplers on the second module.

In a further example, a device may include a substantially planar dielectric substrate having a first major surface and a second major surface spaced from and opposite the first major surface. An auxiliary circuit may be formed on the dielectric substrate. The device may further include a plurality of couplers including a first conductive coupler, a second conductive coupler, a third conductive coupler, and a fourth conductive coupler disposed at spaced locations on the substrate. Each conductive coupler may extend through the substrate from the first major surface to the second major surface and may have a first connector element having a recess disposed at the first major surface of the substrate electrically connected to an associated second connector element forming an extension extending from the second major surface of the substrate. The third conductive coupler may be electrically connected to the second conductive coupler. The fourth conductive coupler may be electrically connected to the auxiliary circuit. An electronic component may be electrically connected to the first and second conductive couplers. The first, second, third, and fourth conductive couplers may be spaced on the substrate such that the third conductive coupler of a first such device is mated with the fourth conductive coupler of a second such device when the first conductive coupler of the first device is mated with the third conductive coupler of the second device, thereby placing the electronic component of the first device electrically in series with the electronic component of the second device and electrically connecting the electronic component of the first device to the auxiliary circuit of the second device.

Advantages of such systems and methods will be more readily understood after considering the drawings and the detailed description below.

BRIEF DESCRIPTION OF THE SEVERAL VIEWS OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

An electrical component module may be configured to stackably interconnect with one or more other such modules. A module may include a planar dielectric board having a plurality of conductive couplers formed in the board. The couplers may mechanically mate with similar couplers on another such module, thereby interconnecting the modules electrically and physically to form an assembly. Electrical components may be mounted on the boards, and these electrical components may accordingly be interconnected as well. Forming the conductive couplers in specific geometrical arrangements may allow offsetting one module relative to another, while still connecting the modules. This offset interconnection may allow various interconnection schemes, such as parallel, series, a combination of the two, or intermodule connectivity within an assembly.

Figure 1:
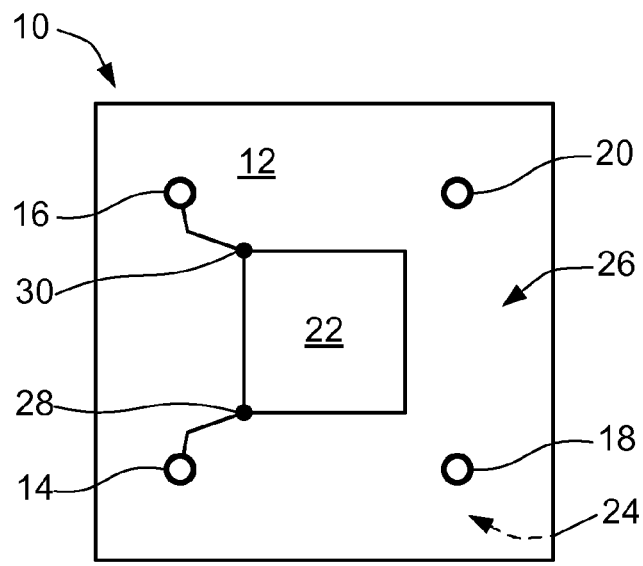
FIG. 1 is a plan view of an illustrative electrical component module.

Referring now to FIG. 1, an illustrative electrical component module is generally shown at 10. In this example, electrical component module 10 may include a substantially planar dielectric substrate 12, a first conductive coupler 14, a second conductive coupler 16, a first aperture 18, a second aperture 20, and an electrical component 22. Substrate 12 may include any suitable structure configured to provide a rigid board having a first major surface 24 and a second major surface 26 spaced from and opposite the first major surface, suitable for mounting electrical components.

Conductive couplers 14 and 16 may be formed in substrate 12, passing from first major surface 24 to second major surface 26. Conductive couplers 14 and 16 may each be any suitable structure configured to mechanically and electrically engage directly with a second such structure. For example, a conductive coupler may include a two-part assembly having a female portion at first major surface 24 and male portion at second major surface 26. Other configurations are possible, as further described below regarding FIG. 2.

Apertures 18 and 20 may each be any suitable structure configured to provide an electrically non-conductive aperture, recess, opening, or hole in substrate 12 sized to accept at least a portion of a conductive coupler. For example, apertures 18 and 20 may be holes in substrate 12 sized to allow entry of a portion of a conductive coupler similar to conductive couplers 14 and 16.

In the example depicted in FIG. 1, conductive couplers 14 and 16, together with apertures 18 and 20, are arranged at positions on substrate 12 corresponding to the corners of a square. More generally, they may be said to be located at equally spaced points on a circle. This arrangement allows any given module 10 to be interconnected with a second such module in four possible ways, three of which provide electrical interconnectivity, as further described below regarding FIGS. 3 and 4.

Module 10 may also include electrical component 22, which may be any suitable electrical component that may be mounted on substrate 12 and electrically connected to first and second conductive couplers. In the example of FIG. 1, electrical component includes a solid-state battery. One skilled in the art will understand that electrical component 22 may also include a resistor, a capacitor, or one of many other standard components known in the art. Continuing with the example of FIG. 1, electrical component 22 may have a first terminal 28 electrically connected to first conductive coupler 14 and a second terminal 30 electrically connected to second conductive coupler 16. For example, a solid state battery may have a positive and a negative terminal, each wired to one of the conductive couplers.

Figure 2:
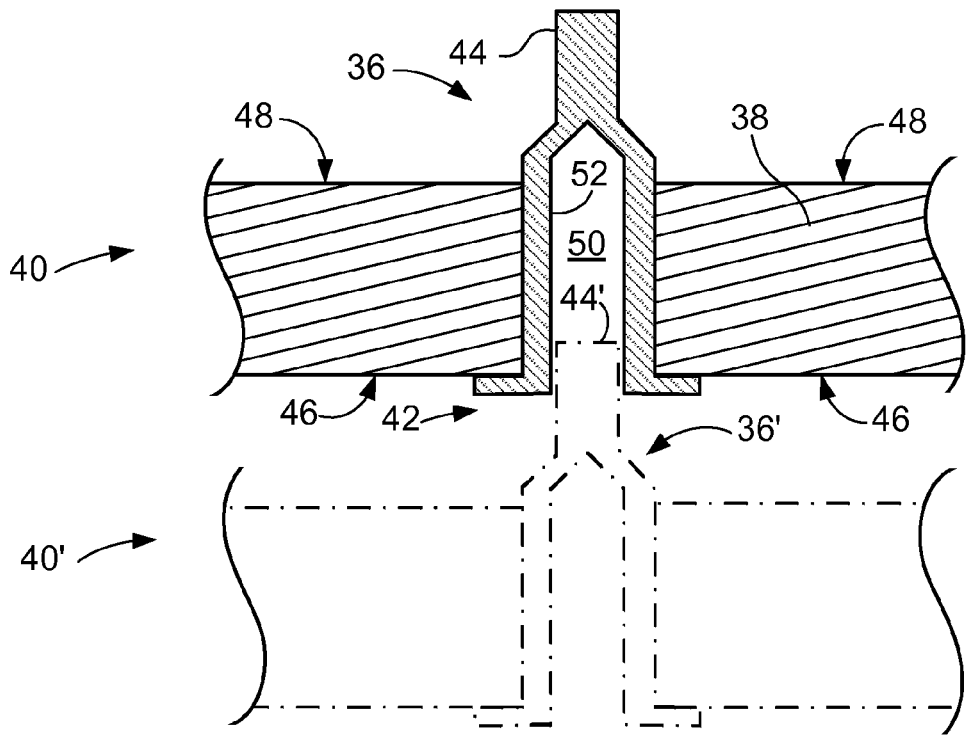
FIG. 2 is a sectional view of an illustrative conductive coupler.

Turning to FIG. 2, a more detailed view of an illustrative conductive coupler 36 is depicted in a substrate 38 of a module 40 which is an example of module 10. Conductive coupler 36 may be similar to conductive couplers 14 and 16, and may include a first connector element 42 disposed at a first major surface 46 of substrate 38 electrically connected to an associated second connector element 44 forming an extension extending normally from a second major surface 48 of the substrate. First connector element 42 may form a recess 50 in the first major surface. Conductive coupler 36 may also include an electrical via 52 extending through the substrate between recess 50 and the associated second connector element 44. Second connector element 44 may form a male connector such as a pin connector, and may be axially aligned with recess 50 of the associated first connector element. As shown in FIG. 2, a second connector element 44' of a second conductive coupler 36' of a second module 40' may engage mechanically and electrically in a friction-fit engagement with first connector element 42 of conductive coupler 36. This mechanical and electrical engageability allows multiple examples of modules 10 to be manually connected or disconnected, greatly facilitating manufacturability and configurability of assemblies.

It should be appreciated that first and second connector elements may take various forms and may include various geometries. For example, second connector element 44 is shown as a hollow pin. However, second connector element may be solid, may be of a different length and/or width, and may include other structures. For example, second connector element 44 may include a flange or other structure (not shown) to limit the depth to which the male connector element may pass into a female connector element. In other examples, via 52 may pass only partially through the substrate. In yet another example, via 52 may be replaced by a conductor such as a wire that electrically connects recess 50 to second connector element 44.

Figure 3:
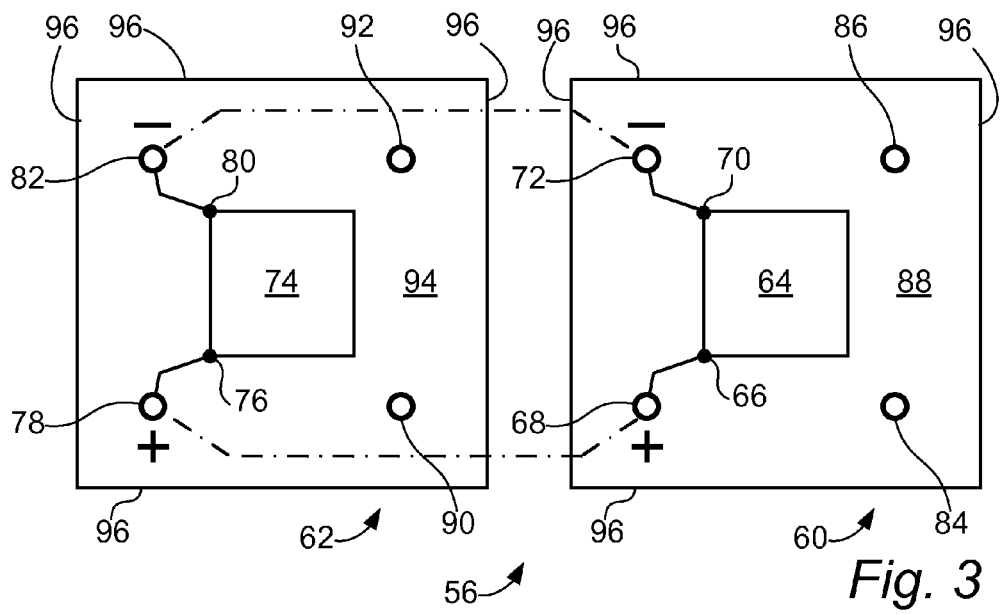
FIG. 3 shows a plan view of two illustrative electrical component modules connected in parallel and shown separated for clarity.
Figure 4:
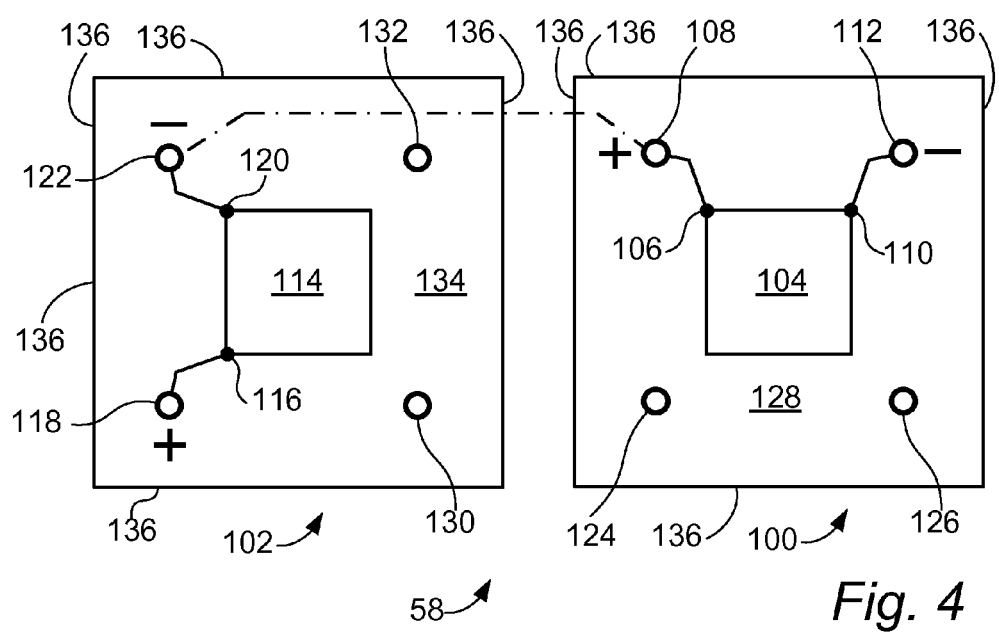
FIG. 4 shows a plan view of two illustrative electrical component modules connected in series and shown separated for clarity.

FIGS. 3 and 4 each depict an assembly including two examples of module 10 in an illustrative interconnection scheme. FIG. 3 shows an assembly 56 with parallel connection and FIG. 4 shows an assembly 58 with one of two possible series connections. In each assembly, the two modules would be stacked in mechanical engagement, but the modules have been separated and shown side by side to better illustrate the connections. The dashed lines between connector elements indicate where electrical connection is made between the stacked modules.

FIG. 3 shows assembly 56 including two examples of module 10, generally indicated at 60 and 62. In the example shown in FIG. 3, module 60 is stacked on top of module 62. Module 60 has a solid-state battery 64 with a positive terminal 66 connected to a conductive coupler 68 and a negative terminal 70 connected to a conductive coupler 72. Similarly, module 62 has a solid-state battery 74 with a positive terminal 76 connected to a conductive coupler 78 and a negative terminal 80 connected to a conductive coupler 82. Module 60 also includes first and second apertures 84 and 86 formed in substrate 88, while module 62 includes first and second apertures 90 and 92 formed in substrate 94.

In the example depicted in FIG. 3, module 60 and module 62 have the same rotational orientation, meaning that module 60 is aligned exactly the same as module 62 when viewed from a position orthogonal to the planes of the respective substrates. Because the substrates in this example have four lateral edges or sides 96, four discrete rotational orientations are possible for each module. As shown in FIG. 3, placing the two modules 60 and 62 in identical discrete rotational orientations results in alignment of conductive coupler 68 with conductive coupler 78 and alignment of conductive coupler 72 with conductive coupler 82. Stacking the two modules, then, results in mating connector 68 with connector 78 and connector 72 with connector 82 in mechanical and electrical engagement. Because connectors 68 and 78 are connected to positive terminals of the respective batteries and connectors 72 and 82 are connected to negative terminals of the respective batteries, this engagement results in a parallel connection of the two batteries.

FIG. 4 shows assembly 58 including two examples of module 10, generally indicated at 100 and 102. In the example shown in FIG. 4, module 100 is stacked on top of module 102. Module 100 has a solid-state battery 104 with a positive terminal 106 connected to a conductive coupler 108 and a negative terminal 110 connected to a conductive coupler 112. Similarly, module 102 has a solid-state battery 114 with a positive terminal 116 connected to a conductive coupler 118 and a negative terminal 120 connected to a conductive coupler 122. Module 100 also includes first and second apertures 124 and 126 formed in substrate 128, while module 102 includes first and second apertures 130 and 132 formed in substrate 134.

Instead of modules having identical rotational orientations as in the example of FIG. 3, in the example of FIG. 4 the conductive couplers of the two modules may be offset by rotating the modules relative to each other. As shown in FIG. 4, module 100 may be in an orientation rotated 90 degrees from the orientation of module 102. Because conductive couplers 108 and 112 together with apertures 124 and 126 are disposed at the corners of an imaginary square, rotating module 100 by 90 degrees aligns conductive coupler 108 with conductive coupler 122, and also aligns aperture 124 with conductive coupler 118. Lateral edges 136 of the modules may also be aligned, indicating that the modules are in one of the discrete rotational alignments possible.

In the example of FIG. 4, stacking the two modules results in mating coupler 108 with coupler 122 in mechanical and electrical engagement and mating coupler 118 with non-conductive aperture 124 in mechanical engagement. Because connectors 108 and 122 are connected to the positive terminal of battery 104 and the negative terminal of battery 114, respectively, this engagement results in a series connection of the two batteries.

It will be appreciated that a series connection may also be achieved by placing module 100 in an orientation 180 degrees from that shown, again resulting in a 90-degree difference between the two modules. Furthermore, it should be understood that the arrangements shown in FIGS. 3 and 4 may be combined in any number of ways to produce more than two modules in series, more than two modules in parallel, or to produce assemblies having a combination of series and parallel modules, simply by stacking the modules as desired.

Other methods may be used to offset modules. For example, two modules may have identical rotational orientation, but be offset laterally to align different conductive couplers, which may be arranged linearly.

Figure 5:
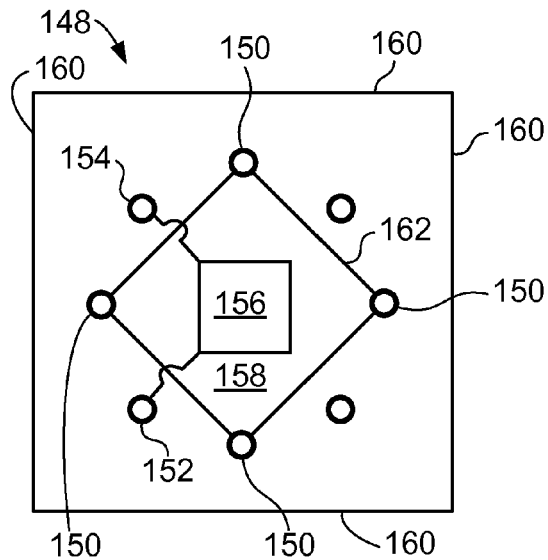
FIG. 5 shows an illustrative module including an illustrative set of conductive couplers.

Turning to FIG. 5, another illustrative module such as module 10 is generally indicated at 148. As shown in FIG. 5, a set of conductive couplers 150 may be provided in addition to conductive couplers 152 and 154 used to connect an electrical component 156. In the example of FIG. 5, module 148 includes a substrate 158 having four sides or lateral edges 160. In general, modules 10 may be regular polygons having more or fewer sides 160 than module 148.

In this example, a rotational offset of the conductive couplers may be used when interconnecting modules. Accordingly, conductive couplers belonging to a certain set, such as conductive couplers 150, may be arranged at equally-spaced points on at least a portion of a circle, and the circle may be centered on the center of the substrate. This arrangement allows conductive couplers from a given set to align with conductive couplers from the corresponding set on another module, in more than one rotational orientation. The number of conductive couplers in equally spaced positions on a circle may correspond to the number of edges 160 of the substrate. This arrangement allows alignment of respective edges of the modules to correspond to alignment of the conductive couplers. For example, a four-sided module 150 (i.e., a module having a four-sided substrate) may have a set of four conductive couplers 150. The four couplers 150 may align, in more than one rotational orientation, with corresponding couplers when the four sides 160 of module 148 are aligned with the four sides of another module.

In other examples, a module may itself be circular, with any number of rotational positions and corresponding couplers. In these and in previous examples, other indicators of rotational orientation may be utilized, such as markers on an outer perimeter of the module.

In some examples, the set of conductive couplers 150 may be configured as a circuit, with one or more electrical conductors 162 connected to the substrate and interconnecting the plurality of conductive couplers 150. In these examples, interconnection of the couplers on two or more stacked modules produces a multi-level circuit that may carry a signal or electrical current from the top module to the bottom module, regardless of rotational orientation of any of the modules. For example, a lead from a thermal sensor may be connected to one of the pin portions of one of the couplers 150, and the signal from that sensor may be carried down through the stack through the circuits formed by the couplers 150 on each module, all of which circuits are interconnected by way of mechanical and electrical engagement of the mated couplers from module to module. It should be understood that more than one such independent circuit formed of electrically connected conductive couplers may be provided on a module, and that each such independent circuit may have couplers located at equally spaced points on a circle, with multiple independent circuits possible on any given circle.

Figure 6:
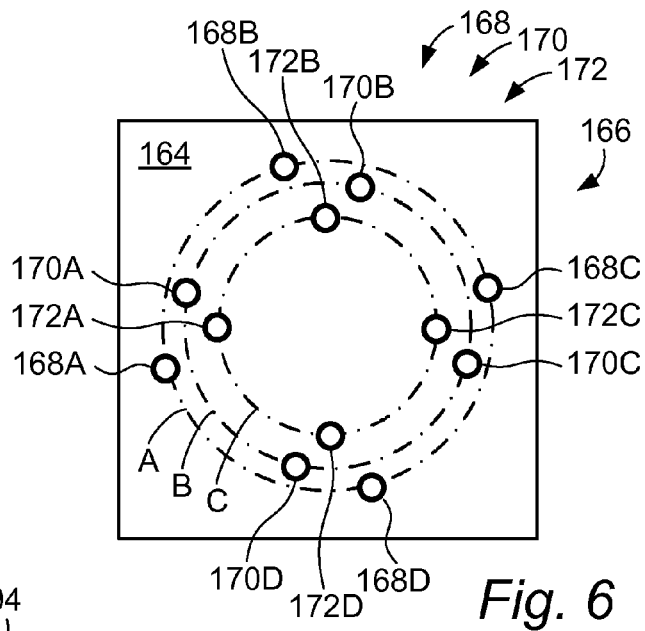
FIG. 6 shows an illustrative module including three illustrative sets of conductive couplers.

For example, FIG. 6 shows three examples of such circuits all formed on a substrate 164 of a module 166: circuit 168, circuit 170, and circuit 172. In this example, circuit 168 includes four conductive couplers 168A, 168B, 168C, and 168D arranged at equally spaced points on a circle A. Circuit 170 includes four conductive couplers 170A, 170B, 170C, and 170D arranged at equally spaced points on a circle B. Circuit 172 includes four conductive couplers 172A, 172B, 172C, and 172D arranged at equally spaced points on a circle C. For clarity, the conductors that connect the couplers of each circuit are not shown. In some examples, not shown, circuits may be formed by connecting on a module two or more circuits such as those just described to form a single circuit arranged on more than one circle.

Figure 7:
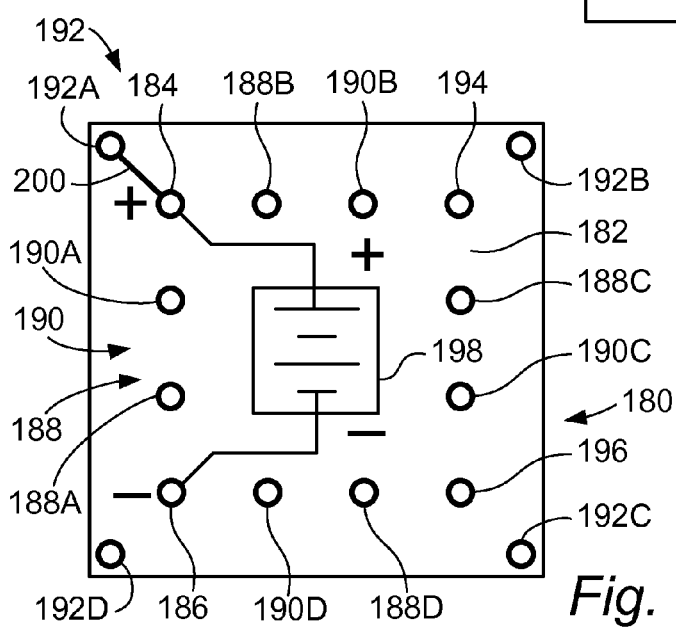
FIG. 7 shows an illustrative module including multiple sets of conductive couplers as well as a battery cell connected to the module.

FIG. 7 shows a module 180 similar to module 10 configured to be stackably interconnectable with other such modules to form an assembly. Module 180 may include a square-shaped substrate 182, a first conductive coupler 184, a second conductive coupler 186, a first circuit 188 including conductive couplers 188A, 188B, 188C, and 188D, a second circuit 190 including conductive couplers 190A, 190B, 190C, and 190D, a third circuit 192 including conductive couplers 192A, 192B, 192C, and 192D, a first aperture 194, and a second aperture 196. A battery cell 198 may be mounted on substrate 182, and may have a positive terminal connected to first conductive coupler 184 and a negative terminal connected to second conductive coupler 186.

Multiple modules 180 may be interconnected by engaging couplers in a stacked configuration. As described above, stacking any two adjacent modules in the same rotational orientation may create a parallel interconnection, while stacking any two adjacent modules in offset rotational orientations may result in a series connection. Combinations of modules may be created having all series, all parallel, or any combination of the two interconnection types.

Each circuit or set of couplers may be independent of any other couplers or circuits on the module. First circuit 188, second circuit 190, and third circuit 192 may each provide an independent electrical pathway for a signal to travel from module to module regardless of rotational orientation of any two adjacent modules in a stack. Third circuit 192 may also be arranged with at least one conductive coupler disposed near first conductive coupler 184 and/or second conductive coupler 186 in order to facilitate installation of a jumper 200 between one of the conductive couplers attached to battery cell 198 and one of the couplers of the third circuit. When modules are interconnected in parallel, a sufficient connection may be made, such as at a printed circuit board (PCB), to the first and second conductive couplers on the bottom-most module 180 in order to complete the battery circuit of all parallel-connected modules. However, this is not possible if modules 180 are connected in series, as the top-most module 180 will not have a return path for one of the first or second conductive couplers. To facilitate a connection of that coupler to the PCB through the intervening modules in this example, jumper 200 may be installed as described.

Figure 8:
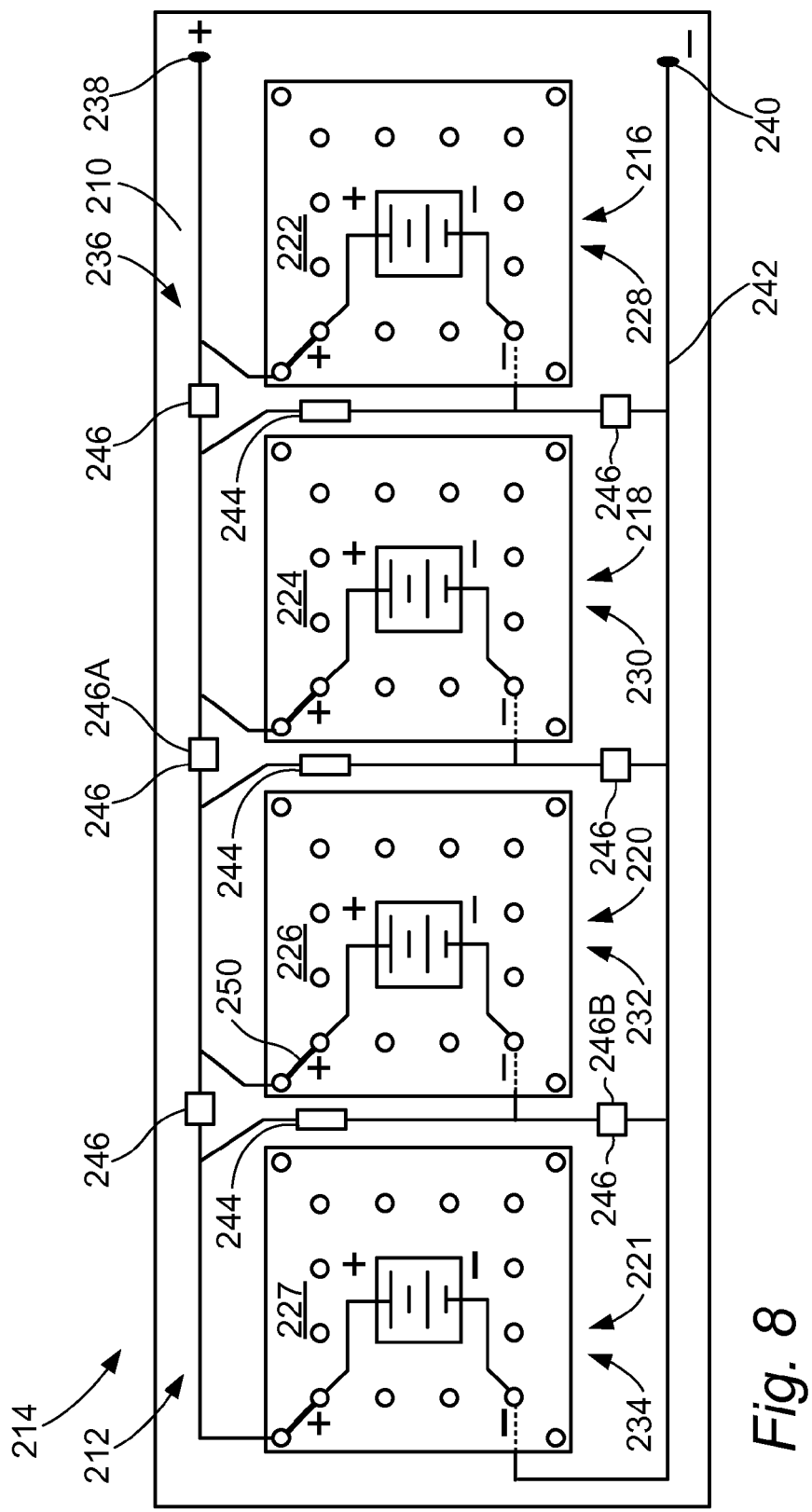
FIG. 8 shows an illustrative printed circuit board with illustrative module assemblies.

FIG. 8 shows a PCB 210 configured to interconnect multiple assemblies 212, each assembly including a stack of modules 214 similar to module 10 or module 180. More specifically, in this example, four assemblies 212 are depicted and referred to as assemblies 216, 218, 220, and 221. In this plan view of the PCB with assemblies, only a topmost module 214 may be seen in each assembly. More specifically, assembly 216 may include topmost module 222, assembly 218 may include topmost module 224, assembly 220 may include topmost module 226, and assembly 221 may include topmost module 227.

PCB 210 may include any suitable number of electrical interfaces. In this example four electrical interfaces 228, 230, 232, and 234 are included, each configured to provide a pluggable mechanical and electrical connection for a module 214 and thereby to provide a pluggable mechanical and electrical connection for an assembly 212. For example, each electrical interface may provide male connector pins (not shown) configured to mate with the first connector elements of all or selected ones of the conductive couplers on the first major surface of the bottom-most module 214 in the module stack of an assembly 212.

PCB 210 may also include a PCB circuit 236 including a positive terminal 238, a negative terminal 240, and a plurality of conductors 242 selectably connecting electrical interfaces 228, 230, 232, and 234 to positive terminal 238 and negative terminal 240. Conductors 242 may selectably connect the interfaces to the terminals by use of jumpers such as series jumpers 244 and parallel jumpers 246. Each jumper may be any suitable structure configured to electrically connect two conductors when in a first state and to electrically disconnect two conductors when in a second state. For example, each jumper may be a standard electrical jumper or electrical switch known in the art. Each series jumper 244 may complete a connection between two successive electrical interfaces such that an assembly on one electrical interface is placed in series connection with an assembly 212 on the other electrical interface. Each parallel jumper 246 may function in concert with another such jumper to connect an electrical interface to the PCB circuit in parallel. For example, parallel jumpers 246A and 246B may place electrical interface 232 and thereby assembly 220 in parallel connection with PCB circuit 236. All of jumpers 246 place all four assemblies in parallel in this example. Correspondingly, all of jumpers 244 place all four assemblies in series.

Various other combinations of jumpers are possible, for example, to create a combination of parallel and series connections with the PCB circuit. For example, two or more of the assemblies distal from terminals 238 and 240 may be connected in series with the series connected in parallel with one or more assemblies proximate to terminals 238 and 240. The configuration shown in FIG. 8 allows each assembly position to contain a single module or a stack of modules connected in series, parallel, or a combination of series and parallel. As described above, a module jumper 250 similar to jumper 200 may be necessary to connect a terminal of the battery of a topmost module such as topmost module 226 to PCB 210. Jumper 250 may connect the appropriate battery terminal conductive coupler of the top module to conductive coupler 192 in the upper left corner, as shown in FIG. 8.

Figure 9:
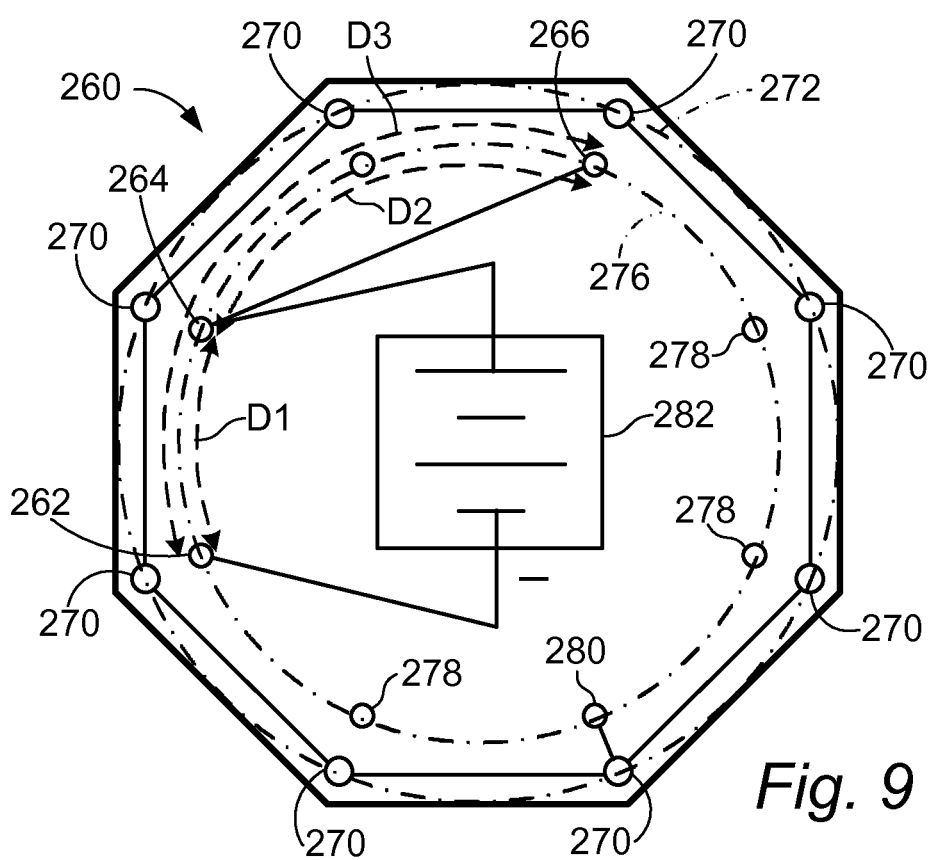
FIG. 9 is a plan view of another illustrative module having eight sides.
Figure 10:
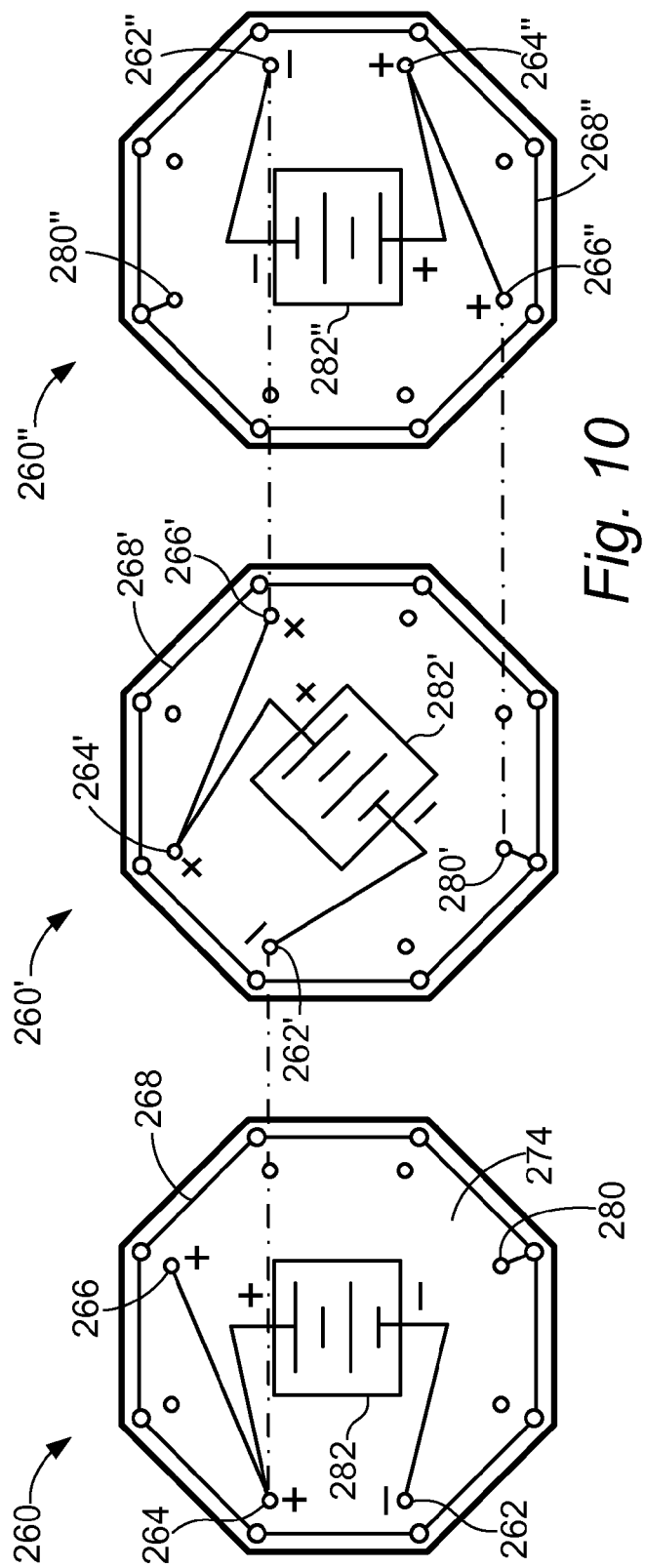
FIG. 10 is a plan view of a stack of three illustrative modules such as the one in FIG. 9, separated to show the individual modules.

In some embodiments, a module may be configured to eliminate the need for a separate top-of-stack jumper such as jumper 250, even if modules are connected in series. FIGS. 9 and 10, for example, show a multi-sided module 260 configured to allow a top module to be stacked in such a way as to connect a terminal of the topmost battery to an auxiliary circuit that will in turn provide an electrical connection down through all modules in the stack. Module 260 may include a first conductive coupler 262, a second conductive coupler 264 electrically isolated from coupler 262, and a third conductive coupler 266 electrically connected to coupler 264. Module 260 may also include an auxiliary circuit 268 formed of electrically interconnected conductive couplers 270 equidistantly spaced at points on an imaginary circle 272 centered on a major surface 274 of module 260. Accordingly, as with the previously described set of couplers 150, interconnection of the couplers on two or more stacked modules produces a multi-level circuit that may carry a signal or electrical current from the top module to the bottom module, regardless of the number of modules in the stack.

Couplers 262, 264, and 266 may be spaced from each other along the circumference of an imaginary circle 276 on major surface 274 of module 260. A circular arc between couplers 262 and 264 may have a length designated D1. Coupler 266 may be spaced along an arc from coupler 264 at a distance D2 that is approximately twice D1, and along an arc from coupler 262 at a distance D3 that is approximately three times D1. One or more apertures 278 may also be spaced on circle 276 to facilitate mechanical interconnection of multiple modules 260. Apertures 278 may be electrically nonconductive apertures similar to apertures 18 and 20 described above.

An electrical connector 280 may be spaced on circle 276 at a distance D3 from coupler 264, and may include an electrically conductive connector configured to electrically and mechanically connect to another module stacked on major surface 274. Connector 280 may not pass through the substrate of module 260 electrically, and accordingly may not create an electrical connection to another module on which module 260 is stacked, i.e., another module placed on a major surface other than surface 274. Connector 280 may be electrically connected to auxiliary circuit 268. Additional apertures 278 may be spaced at regular intervals having a distance D1 between the various couplers on circle 276, including between connector 280 and coupler 262.

A battery 282, or other electrical component, may have terminals connected to couplers 262 and 264. Because coupler 266 is electrically connected to coupler 264, connection to either coupler may be equivalent electrically.

FIG. 10 depicts an assembly of three stacked modules such as module 260. The three modules may be stacked in mechanical engagement, but as in FIGS. 3 and 4, the modules have been separated and shown side by side to better illustrate the connections. The dashed lines between connector elements indicate where electrical connections are made between the stacked modules.

From the drawings and the above description, it should be apparent that multiple copies of module 260 may be interconnected mechanically and electrically, similar to the interconnection of modules 10 and 180. For example, stacking multiple modules 260 on one another without changing the relative rotational orientation of the modules, such that couplers 262 and 264 of each module 260 connect to respective couplers 262 and 264 of another module 260 results in parallel connection of the batteries or other electronic components on each of the modules. Similarly, stacking multiple modules 260 such that coupler 262 of one module is connected to coupler 264 of another, as shown in FIG. 10, results in series connection of the batteries. Unlike the parallel connection method, it may be necessary to orient the modules at different relative rotations to facilitate series connection. As described above, combinations of these connection methods are possible, with batteries in series and/or parallel within the stack.

Modules such as module 260, however, may have additional options regarding interconnection of adjacent modules due to there being three couplers electrically connected to the battery terminals rather than two. As a first option, in the module stack shown in FIG. 10, module 260 may be stacked in series with module 260' by rotating module 260' by 45 degrees (corresponding to distance D1 relative to module 260) to connect coupler 262' on module 260' with coupler 264 on module 260.

To illustrate a second option for connecting modules such as module 260 in series, module 260" may be stacked in series with module 260' by rotating module 260" by 135 degrees (corresponding to distance D3 relative to module 260') to connect coupler 262" on module 260" to coupler 266' on module 260'. This option also illustrates how modules such as module 260 may themselves electrically connect a topmost or outermost module through the stack to the lowermost or innermost module. Specifically, the illustrative 135-degree relative rotation also aligns coupler 266" with connector 280' thereby connecting battery 282" of topmost module 260" to auxiliary circuit 268' of middle module 260' and auxiliary circuit 268 of lowermost module 260, where a connection may be made to an underlying PCB. The connection down through the stack may thus be accomplished without use of a separate jumper on the top-most module.

Figure 11:
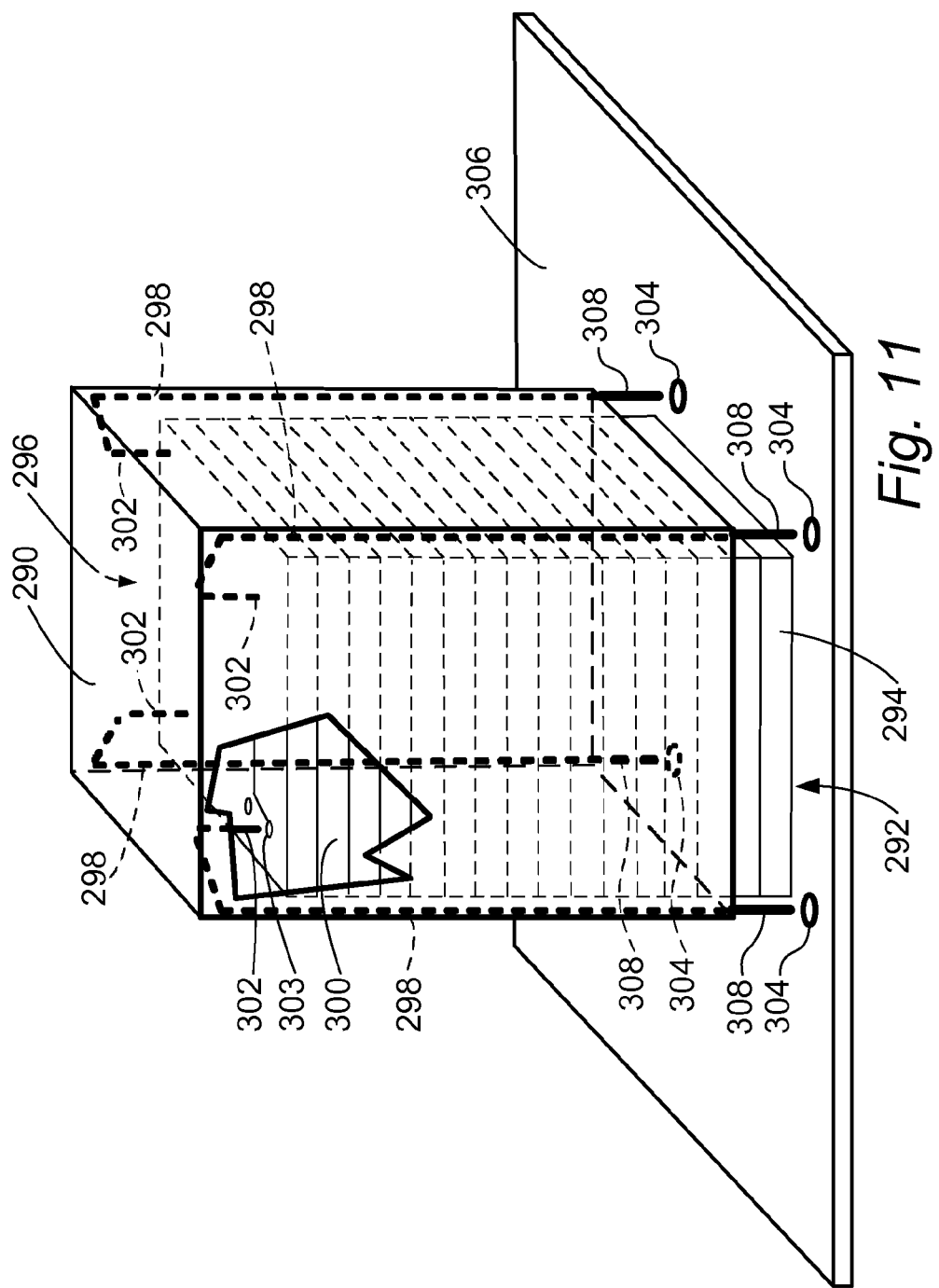
FIG. 11 shows an illustrative cap structure or cover for use with a module assembly.

Turning to FIGS. 11-14, other exemplary structures will now be described for connecting one or more circuits or components on an exposed module of a stack or assembly to an underlying structure such as a PCB. Specifically, FIG. 11 shows an illustrative modular battery stack cap or cover 290 that may be placed over an assembly 292 of stacked modules 294. Cover 290 is shown partially installed over assembly 292. Cover 290 may have an inner chamber 296 conforming to the shape of the assembly, and may incorporate one or more return-path conductors 298, each interconnecting a circuit of topmost module 300 to an underlying PCB, possibly using a conductive probe 302 extending from conductor 298 into the chamber and into a coupler 303 of module 300. Note that each return path conductor may connect to a respective different circuit, or multiple return path conductors may connect to the same circuit. Conductor 298 may connect module 300 to a conductive connector 304 on an underlying PCB 306 through a conductive fastener such as a foot 308 that may be configured to mate with conductive connector 304. Separate return-path conductors 298 may be used to extend any corresponding circuit, such as a power or other circuit, that is exposed on topmost module 300 of the PCB. Cover 290 may be made of any suitable material, such as rigid plastic. Cover 290 may also provide structural integrity, protection, and dust exclusion for the assembly.

Figure 12:
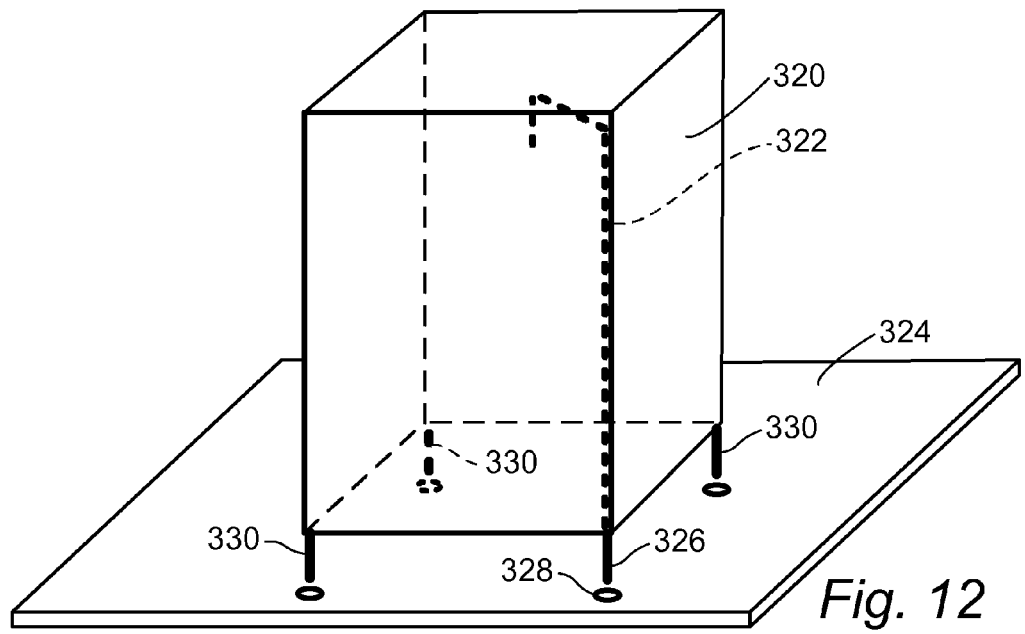
FIG. 12 shows another illustrative cap or cover for use with a module assembly.

FIG. 12 shows another illustrative cover 320 similar to cover 290. In this example, cover 320 may have only a single return path conductor 322 configured to connect a circuit of a topmost module (not shown) to an underlying PCB 324 using a conductive fastener such as a foot 326 that may plug into a corresponding connector 328 on PCB 324. Other fasteners such as fasteners 330 may be used to further secure cover 320 to PCB 324. Fasteners 330 may be electrically isolated or nonconductive.

Figure 13:
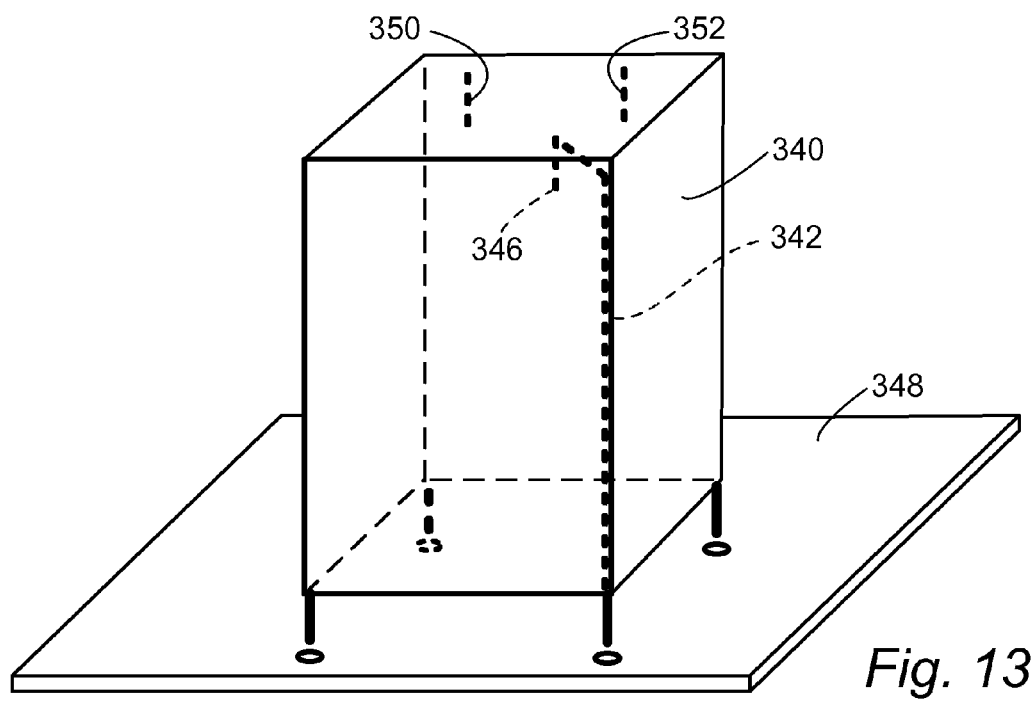
FIG. 13 shows another illustrative cap or cover for use with a module assembly.

FIG. 13 shows another illustrative cover 340 similar to covers 290 and 320. In this example, cover 340 may include a single return path conductor 342 electrically connected to a conductive extension such as probe 346 configured to connect a circuit of a topmost module of an assembly (not shown) to an underlying PCB 348. Additional extensions such as extension 350 and 352 may extend into the chamber of the cover. However, in this example, extensions 350 and 352 may be electrically isolated and/or nonconductive, and may be configured to interface with the topmost module for purposes of stabilization and securing the cover rather than to provide an electrical connection.

Figure 14:
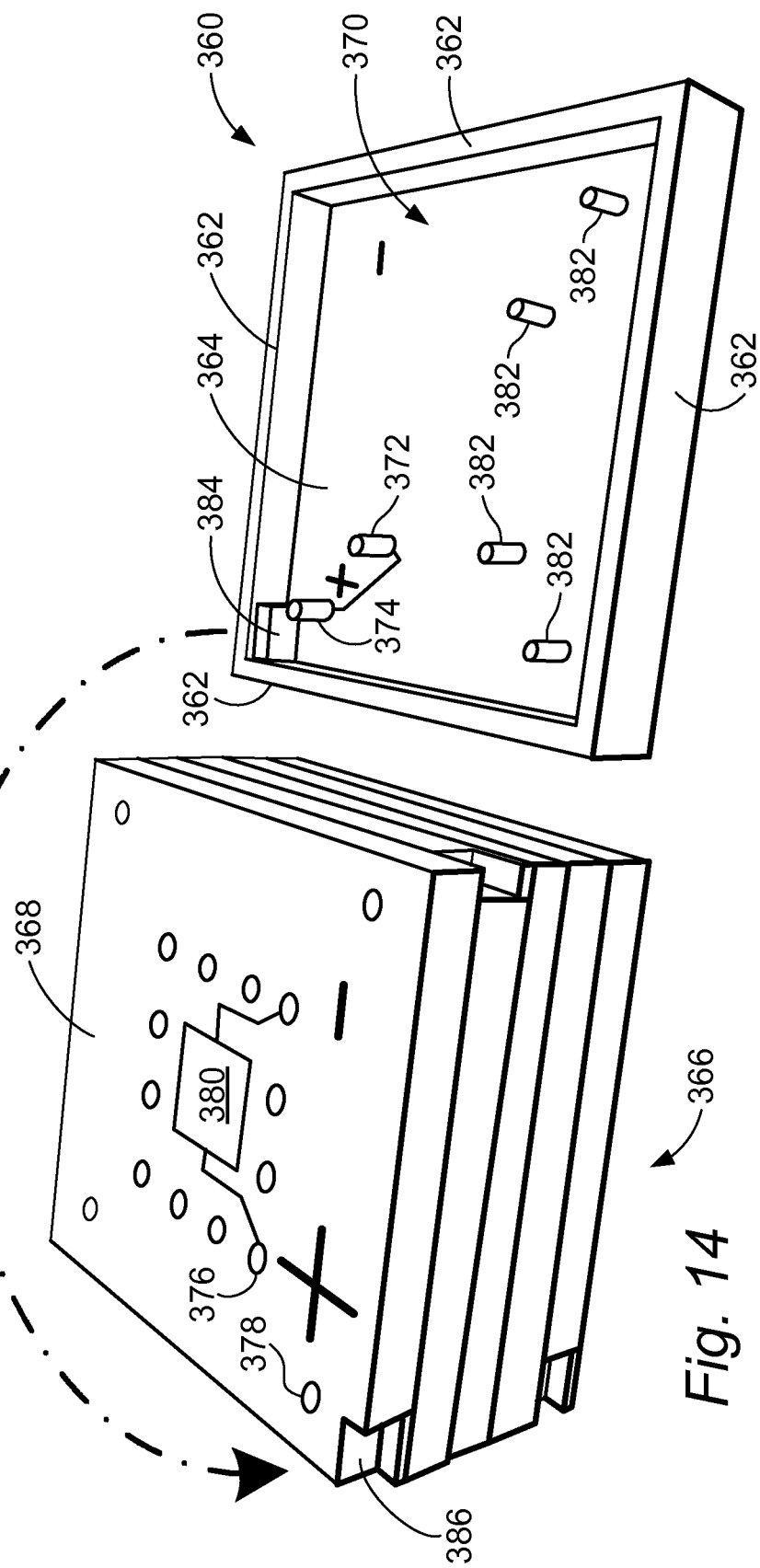
FIG. 14 shows an illustrative keyed module assembly and cap or cover.

FIG. 14 shows yet another illustrative cap or cover 360. In this example, cover 360 may be configured to function as a jumper rather than directly connecting a module to a PCB. Cover 360 may have lateral sidewalls 362 extending normally from an end wall 364. Sidewalls 362 may be sized to partially cover lateral sides of an assembly 366, and may only cover a portion of the assembly, such as all or a portion of a topmost module 368 of the assembly. In this example, cover 360 has multiple members extending from end wall 364 into a chamber 370 formed by the end and sidewalls. For example, cover 360 may include electrically connected conductive members 372 and 374, which may be configured to mate with conductive couplers 376 and 378, respectively, on module 368. When members 372 and 374 are mated with couplers 376 and 378, electronic component 380 on module 368 may be electrically connected through coupler 378 to a circuit that connects component 380 back down through the assembly. Accordingly, cover 360 may function as a jumper such as jumper 250 described above.

Cover 360 may include additional extensions such as extensions 382 depicted in FIG. 14. Extensions 382 may mate with couplers on module 368, and may jumper additional circuits together on module 368. Alternatively, one or more extensions 382 may be electrically conductive and/or isolated, and may provide mechanical stability or security.

Cover 360 and module 368 may be keyed together using a mechanical key and keyway such as key 384 on cover 360 and keyway 386 on module 368. Key 384 and keyway 386 may be configured such that the key and keyway align and mate only when cover 360 is in a desired position, such as a position that aligns extensions 372 and 374 with couplers 376 and 378, respectively. In some examples, the key and keyway may be located on opposite components. In other words, the key may be disposed on a module and the keyway on the cover. Indicia (not shown) may be provided on an exposed surface of cover 360 to indicate a position of the key and keyway.

Accordingly, a system or device as described above for electrical component modules may include one or more of the following examples.

In a first example, a device may include a substantially planar dielectric substrate having a first major surface and a second major surface spaced from and opposite the first major surface. A plurality of conductive couplers may extend through the substrate from the first major surface to the second major surface at spaced locations. Each conductive coupler may have a first connector element disposed at the first major surface of the substrate electrically connected to an associated second connector element forming an extension extending from the second major surface of the substrate. The device may be selectively engageable with another such device by selectively mating the first connector element of a first conductive coupler on the device in mechanical and electrical engagement with the second connector element of a second conductive coupler on the other such device.

The first connector element of each of the conductive couplers may form a recess in the first major surface, and each conductive coupler may include a via extending through the substrate between the recess and the associated second connector element. The second connector element of each of the conductive couplers may form a pin connector axially aligned with the recess of the associated first connector element.

The plurality of conductive couplers may include at least three conductive couplers, and the plurality of conductive couplers may be distributed at equally spaced points on at least a portion of a circle. The second major surface of the substrate may have a geometric center and the circle may have a center coincident with the geometric center of the second major surface.

At least one electrically non-conductive aperture may be formed in the substrate, the at least one aperture and the plurality of conductive couplers together being distributed at equally spaced points on a circle.

The substrate may further include a plurality of lateral edges forming a regular convex polygon. For at least three rotational positions of the device relative to the other such device in which the lateral edges of the substrates of the two devices are aligned, at least a portion of the plurality of conductive couplers of the device may be aligned with at least a portion of the plurality of conductive couplers of the other device.

One or more electrical conductors may be connected to the substrate, interconnecting the plurality of conductive couplers.

The plurality of conductive couplers may be a first plurality. A second plurality of conductive couplers may be included.

In a second example, a system may include a module including a substantially planar dielectric substrate having a first major surface and a second major surface spaced from and opposite the first major surface. A first conductive coupler and a second conductive coupler each may extend through the substrate from the first major surface to the second major surface at spaced locations and have a first connector element disposed at the first major surface of the substrate electrically connected to an associated second connector element forming an extension extending from the second major surface of the substrate. A first electrically non-conductive aperture and a second electrically non-conductive aperture may be arranged with the first and second conductive couplers at the corners of a square. An electrical component may have a first terminal electrically connected to the first conductive coupler and a second terminal electrically connected to the second conductive coupler. The device may be stackably engageable with another such device by selectively mating the second connector element of one of the conductive couplers on the device in mechanical and electrical engagement with the first connector element of one of the conductive couplers on the other device.

The module may be a first module, the system further including a substantially identical second module, the first module having a first rotational orientation and the second module having a second rotational orientation 90 degrees from the first rotational orientation. The second major surface of the first module may face the first major surface of the second module. The second conductive coupler of the first module may be mechanically and electrically engaged with the first conductive coupler of the second module. The electrical components of the first and second modules may be electrically connected in series with each other.

In a third example, a system may include a first module and a second module, each module including a substantially planar dielectric substrate having a first major surface and a second major surface spaced from and opposite the first major surface. A first conductive coupler and a second conductive coupler each may extend through the substrate from the first major surface to the second major surface at spaced locations. Each conductive coupler may further have a first connector element disposed at the first major surface of the substrate electrically connected to an associated second connector element forming an extension extending from the second major surface of the substrate. An electrical energy storage unit may have a positive terminal electrically connected to the first conductive coupler and a negative terminal electrically connected to the second conductive coupler. The first module may be stackably engaged with the second module, the second connector element of one of the conductive couplers on the first module being selectively mated in mechanical and electrical engagement with the first connector element of one of the conductive couplers on the second module.

The second major surface of the substrate of each module may further have a geometric center. Each module may further including an auxiliary plurality of conductive couplers in addition to the first and second conductive couplers, the auxiliary plurality of conductive couplers being distributed at equally spaced points on at least a portion of a circle, the circle having a center disposed substantially at the geometric center of the second major surface. Each one of the auxiliary plurality of conductive couplers of the first module may be selectively mated to a selected one of the auxiliary plurality of conductive couplers of the second module. Each module may further include one or more electrical conductors connected to the substrate and interconnecting the auxiliary plurality of conductive couplers. The second module may further include an electrical conductor connecting a selected one of the first and second conductive couplers to a selected one of the auxiliary plurality of conductive couplers.

The first connector element of each of the conductive couplers may form a recess in the first major surface, and each conductive coupler may include a via extending through the substrate between the recess and the associated second connector element. The second connector element of each of the conductive couplers may form a pin connector axially aligned with the recess of the associated first connector element.

The first and second conductive couplers of the first module may be selectively mated in mechanical and electrical engagement with the respective first and second conductive couplers of the second module, wherein the electrical energy storage units of the first and second module are electrically connected in parallel with each other.

The first module may be oriented in a first planar rotation, and the second module being oriented in a second planar rotation different from the first planar rotation. The second conductive coupler of the first module may be selectively mated in mechanical and electrical engagement with the first conductive coupler of the second module, wherein the electrical energy storage units of the first and second module are electrically connected in series with each other.

A third module substantially identical to the first and second modules may be included, the second module being reversibly engaged with the third module, the second connector element of one of the conductive couplers on the second module being selectively mated in mechanical and electrical engagement with the first connector element of one of the conductive couplers on the third module.

The first and second conductive couplers of the first module may be selectively mated in mechanical and electrical engagement with the respective first and second conductive couplers of the second module, and the second conductive coupler of the second module may be selectively mated in mechanical and electrical engagement with the first conductive coupler of the third module, wherein the electrical energy storage units of the first and second modules are electrically connected in parallel and the electrical storage units of the second and third modules are electrically connected in series.

Each module may further include a first electrically non-conductive aperture and a second electrically non-conductive aperture, each aperture formed in the substrate and extending through the substrate from the first major surface to the second major surface. The first conductive coupler, the second conductive coupler, the first aperture, and the second aperture may be distributed at points corresponding to corners of a square having a center coincident with a geometric center of the second surface of the substrate. When the second module is rotated 90 degrees relative to the first module with the second major surface of the first module facing the first major surface of the second module, one of the first and second conductive couplers on the first module may align with one of the first and second conductive couplers on the second module, and the other of the first and second conductive couplers on the first module may align with an aperture on the second module.

In a fourth example, a device may include a substantially planar dielectric substrate having a first major surface and a second major surface spaced from and opposite the first major surface, an auxiliary circuit formed on the dielectric substrate, and a plurality of couplers. The plurality of couplers may include a first conductive coupler, a second conductive coupler, a third conductive coupler, and a fourth conductive coupler disposed at spaced locations on the substrate, each conductive coupler extending through the substrate from the first major surface to the second major surface and having a first connector element having a recess disposed at the first major surface of the substrate electrically connected to an associated second connector element forming an extension extending from the second major surface of the substrate. The third conductive coupler may be electrically connected to the second conductive coupler, and the fourth conductive coupler may be electrically connected to the auxiliary circuit. The device may further include an electronic component electrically connected to the first and second conductive couplers. The first, second, third, and fourth conductive couplers may be spaced on the substrate such that the third conductive coupler of a first such device is mated with the fourth conductive coupler of a second such device when the first conductive coupler of the first device is mated with the third conductive coupler of the second device, thereby placing the electronic component of the first device electrically in series with the electronic component of the second device and electrically connecting the electronic component of the first device to the auxiliary circuit of the second device.

The third conductive coupler may be spaced from the second conductive coupler by a first distance along an arc of a circle centered on the first major surface. The second conductive coupler may be spaced from the first conductive coupler on another arc of the circle by a second distance that is approximately one half the first distance.

The plurality of couplers may be distributed to define selectable discrete rotational positions of the first device relative the second device, and the auxiliary circuit of the first device may be configured to electrically connect to the auxiliary circuit of the second device, regardless of the selected relative rotational position of the second device to the first device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof The corresponding structures, materials, acts, and equivalents of all means or step plus function elements in the claims below are intended to include any structure, material, or act for performing the function in combination with other claimed elements as specifically claimed. The description of the various embodiments of the present invention has been presented for purposes of illustration, but is not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising
a substantially planar dielectric substrate having a first major surface and a second major surface spaced from and opposite the first major surface;
a plurality of conductive couplers extending through the substrate from the first major surface to the second major surface at spaced locations;
each conductive coupler having a first connector element disposed at the first major surface of the substrate electrically connected to an associated second connector element forming an extension extending from the second major surface of the substrate;
wherein the device is selectively engageable with another such device by selectively mating the first connector element of a first conductive coupler on the device in mechanical and electrical engagement with the second connector element of a second conductive coupler on the other such device; and
wherein the selective mating includes a rotation of one of the devices to shift alignment of the couplers between a serial and a parallel connection.

2. The device of claim 1, wherein the first connector element of each of the conductive couplers forms a recess in the first major surface, and each conductive coupler includes a via extending through the substrate between the recess and the associated second connector element.

3. The device of claim 2, wherein the second connector element of each of the conductive couplers forms a pin connector axially aligned with the recess of the associated first connector element.

4. The device of claim 1, wherein the plurality of conductive couplers includes at least three conductive couplers, and the plurality of conductive couplers are distributed at equally spaced points on at least a portion of a circle.

5. The device of claim 4, wherein the second major surface of the substrate has a geometric center and the circle has a center coincident with the geometric center of the second major surface.

6. The device of claim 1, further including at least one electrically non-conductive aperture formed in the substrate, the at least one aperture and the plurality of conductive couplers together being distributed at equally spaced points on a circle.

7. The device of claim 1, the substrate further comprising a plurality of lateral edges forming a regular convex polygon;
wherein for at least three rotational positions of the device relative to the other such device in which the lateral edges of the substrates of the two devices are aligned, at least a portion of the plurality of conductive couplers of the device are aligned with at least a portion of the plurality of conductive couplers of the other device.

8. The device of claim 1, further comprising one or more electrical conductors connected to the substrate and interconnecting the plurality of conductive couplers.

9. The device of claim 1, wherein the plurality of conductive couplers is a first plurality, the device further including a second plurality of conductive couplers.

10. A system comprising
a module including
a substantially planar dielectric substrate having a first major surface and a second major surface spaced from and opposite the first major surface;
a first conductive coupler and a second conductive coupler, each conductive coupler extending through the substrate from the first major surface to the second major surface at spaced locations and having a first connector element disposed at the first major surface of the substrate electrically connected to an associated second connector element forming an extension extending from the second major surface of the substrate;
a first electrically non-conductive aperture and a second electrically non-conductive aperture, the first and second apertures arranged with the first and second conductive couplers; and
an electrical component having a first terminal electrically connected to the first conductive coupler and a second terminal electrically connected to the second conductive coupler,
wherein a device is stackably engageable with another such device by selectively mating the second connector element of one of the conductive couplers on the device in mechanical and electrical engagement with the first connector element of one of the conductive couplers on the other device.

11. The system of claim 10, the module being a first module, the system further including a substantially identical second module,
the first module having a first rotational orientation and the second module having a second rotational orientation 90 degrees from the first rotational orientation;
the second major surface of the first module facing the first major surface of the second module;
the second conductive coupler of the first module being mechanically and electrically engaged with the first conductive coupler of the second module;
wherein the electrical components of the first and second modules are electrically connected in series with each other.

12. A system comprising
a first module and a second module, each module including
a substantially planar dielectric substrate having a first major surface and a second major surface spaced from and opposite the first major surface;
a first conductive coupler and a second conductive coupler, each conductive coupler extending through the substrate from the first major surface to the second major surface at spaced locations;
each conductive coupler further having a first connector element disposed at the first major surface of the substrate electrically connected to an associated second connector element forming an extension extending from the second major surface of the substrate;
an electrical energy storage unit having a positive terminal electrically connected to the first conductive coupler and a negative terminal electrically connected to the second conductive coupler; and
the first module being stackably engaged with the second module, the second connector element of one of the conductive couplers on the first module being selectively mated in mechanical and electrical engagement with the first connector element of one of the conductive couplers on the second module, wherein the selective mating includes a rotation of one of the devices to shift alignment of the couplers between a serial and a parallel connection.

13. The system of claim 12, the second major surface of the substrate of each module further having a geometric center; and each module further including an auxiliary plurality of conductive couplers in addition to the first and second conductive couplers, the auxiliary plurality of conductive couplers being distributed at equally spaced points on at least a portion of a circle, the circle having a center disposed substantially at the geometric center of the second major surface;

wherein each one of the auxiliary plurality of conductive couplers of the first module is selectively mated to a selected one of the auxiliary plurality of conductive couplers of the second module.

14. The system of claim 13, each module further comprising one or more electrical conductors connected to the substrate and interconnecting the auxiliary plurality of conductive couplers.

15. The system of claim 14, the second module further including an electrical conductor connecting a selected one of the first and second conductive couplers to a selected one of the auxiliary plurality of conductive couplers.

16. The system of claim 12, wherein the first connector element of each of the conductive couplers forms a recess in the first major surface, and each conductive coupler includes a via extending through the substrate between the recess and the associated second connector element.

17. The system of claim 16, wherein the second connector element of each of the conductive couplers forms a pin connector axially aligned with the recess of the associated first connector element.

18. The system of claim 12,
the first and second conductive couplers of the first module being selectively mated in mechanical and electrical engagement with the respective first and second conductive couplers of the second module,
wherein the electrical energy storage units of the first and second module are electrically connected in parallel with each other.

19. The system of claim 12,
the first module being oriented in a first planar rotation,
the second module being oriented in a second planar rotation different from the first planar rotation,
the second conductive coupler of the first module being selectively mated in mechanical and electrical engagement with the first conductive coupler of the second module,
wherein the electrical energy storage units of the first and second module are electrically connected in series with each other.

20. The system of claim 12, further including a third module substantially identical to the first and second modules, the second module being reversibly engaged with the third module, the second connector element of one of the conductive couplers on the second module being selectively mated in mechanical and electrical engagement with the first connector element of one of the conductive couplers on the third module.

21. The system of claim 20,
the first and second conductive couplers of the first module being selectively mated in mechanical and electrical engagement with the respective first and second conductive couplers of the second module, and
the second conductive coupler of the second module being selectively mated in mechanical and electrical engagement with the first conductive coupler of the third module,
wherein the electrical energy storage units of the first and second modules are electrically connected in parallel and the electrical storage units of the second and third modules are electrically connected in series.

22. The system of claim 12, each module further including a first electrically non-conductive aperture and a second electrically non-conductive aperture, each aperture formed in the substrate and extending through the substrate from the first major surface to the second major surface;
the first conductive coupler, the second conductive coupler, the first aperture, and the second aperture being distributed at points corresponding to corners of a square having a center coincident with a geometric center of the second surface of the substrate;
wherein when the second module is rotated 90 degrees relative to the first module with the second major surface of the first module facing the first major surface of the second module, one of the first and second conductive couplers on the first module aligns with one of the first and second conductive couplers on the second module, and the other of the first and second conductive couplers on the first module aligns with an aperture on the second module.

23. A device comprising:
a substantially planar dielectric substrate having a first major surface and a second major surface spaced from and opposite the first major surface;
an auxiliary circuit formed on the dielectric substrate;
a plurality of couplers including a first conductive coupler, a second conductive coupler, a third conductive coupler, and a fourth conductive coupler disposed at spaced locations on the substrate, each conductive coupler extending through the substrate from the first major surface to the second major surface and having a first connector element having a recess disposed at the first major surface of the substrate electrically connected to an associated second connector element forming an extension extending from the second major surface of the substrate;
the third conductive coupler being electrically connected to the second conductive coupler;
the fourth conductive coupler being electrically connected to the auxiliary circuit; and
an electronic component electrically connected to the first and second conductive couplers;
the first, second, third, and fourth conductive couplers being spaced on the substrate such that the third conductive coupler of a first such device is mated with the fourth conductive coupler of a second such device when the first conductive coupler of the first device is mated with the third conductive coupler of the second device, thereby placing the electronic component of the first device electrically in series with the electronic component of the second device and electrically connecting the electronic component of the first device to the auxiliary circuit of the second device.

24. The device of claim 23, wherein the third conductive coupler is spaced from the second conductive coupler by a first distance along an arc of a circle centered on the first major surface, the second conductive coupler is spaced from the first conductive coupler on another arc of the circle by a second distance that is approximately one half the first distance.

25. The device of claim 23, wherein the plurality of couplers are distributed to define selectable discrete rotational positions of the first device relative the second device, and the auxiliary circuit of the first device is configured to electrically connect to the auxiliary circuit of the second device, regardless of the selected relative rotational position of the second device to the first device.

* * * * *